(12) United States Patent
Prasad et al.

(10) Patent No.: US 9,530,880 B2
(45) Date of Patent: Dec. 27, 2016

(54) DMOS TRANSISTOR WITH TRENCH SCHOTTKY DIODE

(71) Applicant: Micrel, Inc., San Jose, CA (US)

(72) Inventors: Jayasimha Swamy Prasad, San Jose, CA (US); Paul McKay Moore, Fremont, CA (US); David Raymond Zinn, San Jose, CA (US)

(73) Assignee: Micrel, Inc., Chandler, AZ (US)

( * ) Notice: Subject to any disclaimer, the term of this patent is extended or adjusted under 35 U.S.C. 154(b) by 60 days.

(21) Appl. No.: 14/636,623

(22) Filed: Mar. 3, 2015

(65) Prior Publication Data

US 2016/0260831 A1 Sep. 8, 2016

(51) Int. Cl.
| | | |
|---|---|---|
| H01L 29/66 | (2006.01) | |
| H01L 29/78 | (2006.01) | |
| H01L 29/872 | (2006.01) | |
| H01L 29/10 | (2006.01) | |
| H01L 29/45 | (2006.01) | |
| H01L 29/47 | (2006.01) | |

(52) U.S. Cl.
CPC ....... *H01L 29/7806* (2013.01); *H01L 29/1095* (2013.01); *H01L 29/45* (2013.01); *H01L 29/47* (2013.01); *H01L 29/8725* (2013.01)

(58) Field of Classification Search
CPC ............. H01L 29/7813; H01L 29/7802; H01L 29/7806; H01L 29/1095; H01L 29/8725; H01L 29/45; H01L 29/47; H01L 29/66
See application file for complete search history.

(56) References Cited

U.S. PATENT DOCUMENTS

| | | | |
|---|---|---|---|
| 6,686,614 B2 | 2/2004 | Tihanyi | |
| 7,745,846 B2 | 6/2010 | Korec et al. | |
| 8,507,978 B2 * | 8/2013 | Bhalla | H01L 29/407 257/328 |
| 2011/0049564 A1 * | 3/2011 | Guan | H01L 29/66325 257/147 |
| 2012/0267711 A1 * | 10/2012 | Grebs | H01L 29/41741 257/331 |

* cited by examiner

*Primary Examiner* — Daniel Luke
*Assistant Examiner* — Khatib Rahman
(74) *Attorney, Agent, or Firm* — Van Pelt, Yi & James LLP

(57) ABSTRACT

A DMOS transistor integrates a trench Schottky diode into the body contact of the transistor where the body region surrounding the Schottky metal layer forms a guard ring for the Schottky diode.

10 Claims, 6 Drawing Sheets

DMOS TRANSISTOR WITH TRENCH SCHOTTKY DIODE

BACKGROUND OF THE INVENTION

DC-DC power converters implementing synchronous rectification use power MOSFET devices as the high-side power switch and the low-side power switch where the power switches operate to regulate the delivery of current to a load. In operation, both power switches are off before one is being turned on. During the time when both power switches are turned off, the body diode of the low-side MOSFET device conducts the load current. Because the body diode of a MOSFET device has a forward voltage of about 0.7 volt, conduction through the body diode results in significant conduction loss which degrades the efficiency of the power converter. Furthermore, the body diode of the MOSFET device has a high reverse-recovery charge, resulting in additional efficiency loss.

To improve the conversion efficiency of the power converter, a Schottky diode is often added in parallel with the MOSFET body diode, as shown in FIG. 1. When the power switches of the power converter are implemented using N-type MOSFET devices (or NMOS transistors), the NMOS transistor M1 has a body diode D1 formed by the P-type body region as the anode and the N-type drain region as the cathode. To improve conversion efficiency, a Schottky diode SD1 is connected in parallel with the body diode D1. The anode of the Schottky diode SD1 is electrically connected to the source terminal of the NMOS transistor M1 or the anode of the body diode D1. The cathode of the Schottky diode SD1 is electrically connected to the drain terminal of the NMOS transistor M1 or the cathode of the body diode D1. The Schottky diode SD1 has a lower forward bias voltage (e.g. 0.3V) than that of the body diode D1 and thus reduces the forward voltage drop as well as improves recovery time.

More specifically, a Schottky diode is a semiconductor device formed by a metal contacting a semiconductor layer. The junction between the metal and the semiconductor layer forms a rectifying junction with improved diode switching capability as compared to p-n junction diodes formed entirely in a semiconductor layer. Schottky diodes thus have lower turn-on voltages and faster switching speeds as compared to p-n junction diodes.

While it is desirable to connect a Schottky diode with a MOSFET device, integrating a Schottky diode with MOSFET devices increases the die size and the cost of the power converter.

FIG. 2 is a cross-sectional view of a conventional double-diffused MOS (DMOS) transistor which can be used as the power transistor in a power converter. DMOS transistors can be formed as vertical devices (vertical DMOS or VDMOS) or lateral devices (lateral DMOS or LDMOS). In the present example, a vertical DMOS transistor is shown. Referring to FIG. 2, an N-type vertical DMOS transistor 10 is formed on an N+ substrate 12 and an N-type epitaxial layer 14. The DMOS transistor 10 includes a gate electrode formed by a polysilicon layer 22 and insulated from the epitaxial layer 14 by a thin gate dielectric layer 20. The DMOS transistor 10 further includes a P-type body region 16 formed in the N-type epitaxial layer 14 and N+ source regions 18 formed in the P-body region 16. A source electrode is formed using a metal layer 26, formed above an insulating layer 24, connecting to both the N+ source region 18 and the P-body region 16. The N-type epitaxial layer 14 and the N+ substrate 12 form the drain of the DMOS transistor 10. A drain electrode is formed using a metal layer 28 formed on the backside of N+ substrate 12. The body region under the gate electrode between the N+ source region 18 and the N-epitaxial layer 14 form the channel region of the DMOS transistor. When the DMOS transistor 10 is turned on, the forward current flows vertically from the drain electrode through the N+ substrate and the N-type epitaxial layer through the channel to the source electrode.

The vertical DMOS transistor 10 includes a body diode formed by the P-body region 16 as the anode and the N-epitaxial layer 14 as the cathode. When the gate voltage is held above threshold, the P-body layer inverts and current can flow from drain to source when drain is positive as shown by the arrows. When the gate of the transistor is held at zero volts, the transistor is turned off and there will be no current even when the drain is at a positive voltage. However, if the drain is biased to a negative voltage, the body diode between P-body region and the N-epitaxial layer will turn-on and current can flow from the source to the drain even when the DMOS device is turned off. When the DMOS transistor 10 is used as a low-side power switch in a power converter, conduction through the body diode results in significant conduction loss due to the high turn on voltage (e.g. 0.7V) and the high reverse-recovery charge.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a DMOS transistor integrates a trench Schottky diode into the body contact of the transistor where the body region surrounding the Schottky metal layer forms a guard ring for the Schottky diode. In this manner, a DMOS transistor is formed incorporating a Schottky diode connected in parallel with the body diode of the DMOS transistor without consuming additional silicon real estate. Furthermore, the trench Schottky diode can be formed using standard fabrication processes of the DMOS transistor, without requiring significant process changes.

The DMOS transistor with an integrated trench Schottky diode with body region guard ring can be advantageously applied as a power transistor in a power converter. More specifically, the DMOS transistor can be used as the low-side power switch to realize synchronous rectification where the Schottky diode improves the conversion efficiency of the power converter. In some embodiments, the DMOS transistor is configured as a vertical device (vertical DMOS or VDMOS) with a vertical drain current path. In other embodiments, the DMOS transistor is configured as a lateral device (lateral DMOS or LDMOS). The trench Schottky diode with a body region guard ring of the present invention can be applied to both VDMOS and LDMOS transistor devices.

Figure 1:
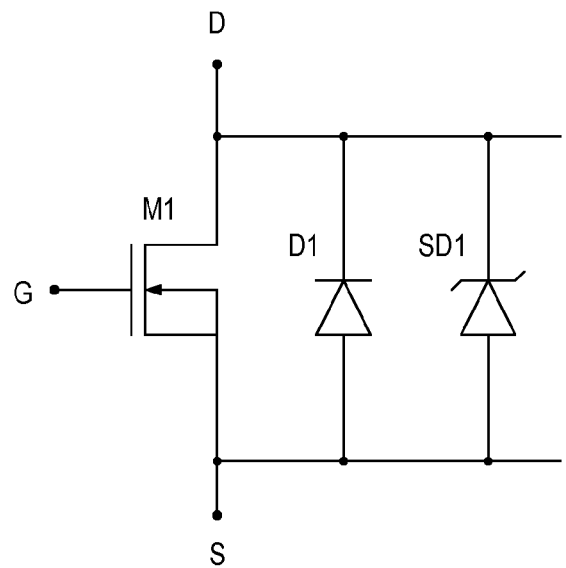
FIG. 1 is a circuit diagram illustrating the parallel connection of a Schottky diode with a power MOSFET and the body diode of the power MOSFET.
Figure 2:
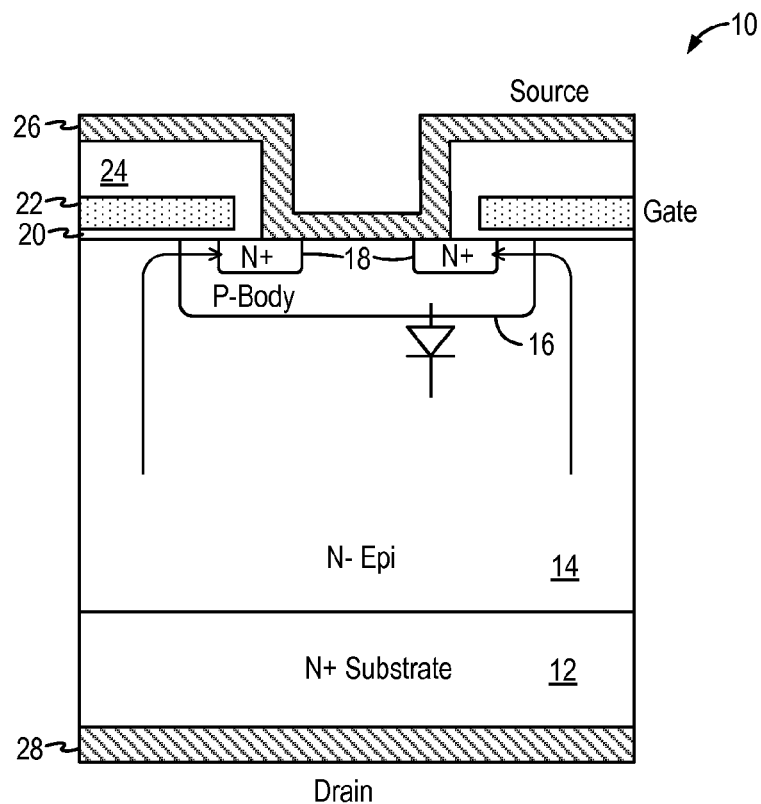
FIG. 2 is a cross-sectional view of a conventional double-diffused MOS (DMOS) transistor.
Figure 3:
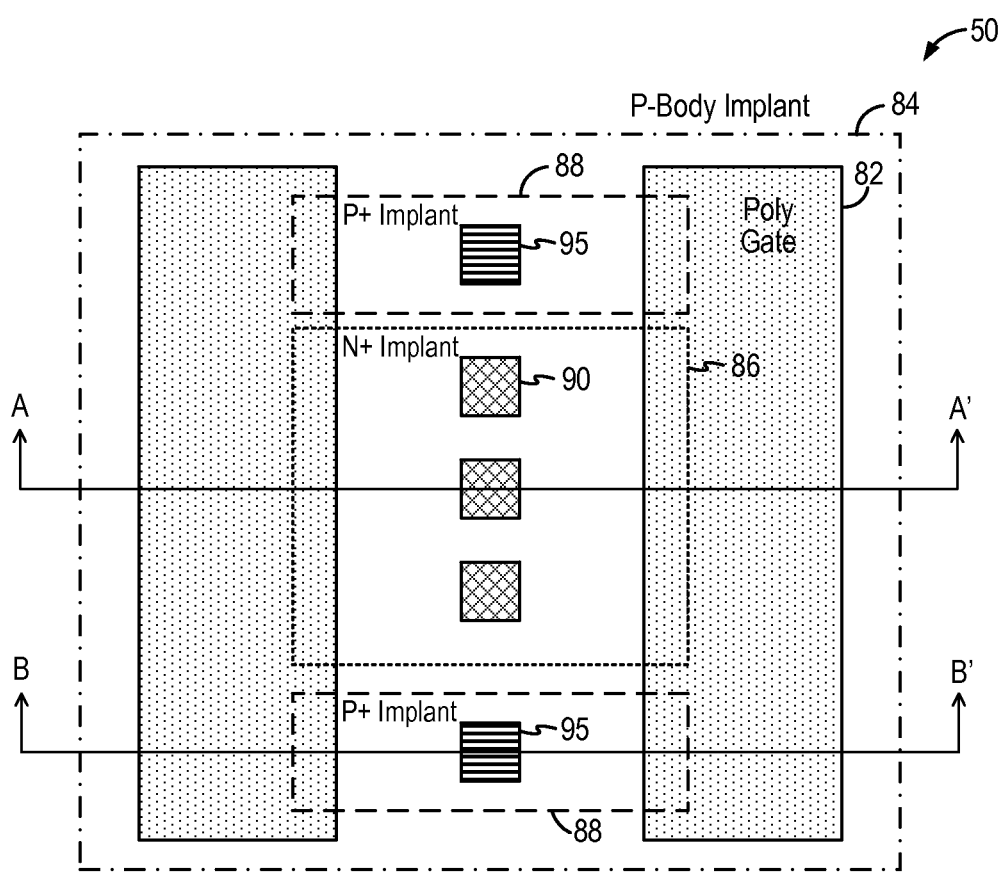
FIG. 3 is a top view illustrating the layout of a vertical DMOS transistor with an integrated trench Schottky diode with body region guard ring in embodiments of the present invention.

FIG. 3 is a top view illustrating the layout of a vertical DMOS transistor with an integrated trench Schottky diode with body region guard ring in embodiments of the present invention. More specifically, FIG. 3 illustrates the layout of a DMOS transistor cell which can be repeated on a semiconductor substrate and connected in parallel to form a power transistor. Moreover, in the present embodiment, FIG. 3 illustrates an N-type DMOS transistor. The use of an N-type DMOS transistor is illustrative only and not intended to be limiting. In other embodiments, the DMOS transistor can be configured as a P-type DMOS transistor by using diffusion regions of the reversed polarities.

Referring to FIG. 3, a vertical DMOS transistor 50 includes a polysilicon layer 82 forming the gate electrode. In the present embodiment, the polysilicon gate 82 is drawn as parallel stripes. The P-type body region is formed using a P-body implant mask defining a P-body implant area 84. In the fabrication process, the P-type body implant is blocked by the polysilicon layer 82 and the P-body region is thus formed everywhere but under the polysilicon gate 82 except for the lateral diffusion under the polysilicon gate 82. The N+ source region is formed using an N+ implant mask defining an N+ implant area 86. To provide ohmic contact to the P-body region thus formed, P+ body contact regions are formed using a P+ implant mask defining P+ implant areas 88. Both the N+ implant area 86 and the P+ implant areas 88 overlap the polysilicon gate 86. But for a small amount of lateral diffusion under the polysilicon gate, the N+ implant and P+ implant are formed self-aligned to the edge of the polysilicon gate.

To make electrical connection to the source and the body of the DMOS transistors, contacts are formed at the N+ source region and the P+ body contact regions. For example, source contacts 90 are used to connect to the N+ source region 86 while body contacts 95 are used to connect to the P+ body contact regions. In embodiments of the present invention, the source contacts 90 are formed as standard or conventional contacts. For example, the source contacts 90 can be formed as tungsten plug contacts. Meanwhile, in embodiments of the present invention, the body contact are formed as Schottky contacts 95. In the present description, a "Schottky contact" refers to a contact formed in a lightly doped semiconductor region which incorporates a trench Schottky diode, as will be explained in more detail below. It is instructive to note that the Schottky contact 95 can be formed having the same dimension as a standard contact, such as source contact 90. Thus, in accordance with embodiments of the present invention, integrating a Schottky diode into a contact does not require additional silicon real estate.

Figure 4:
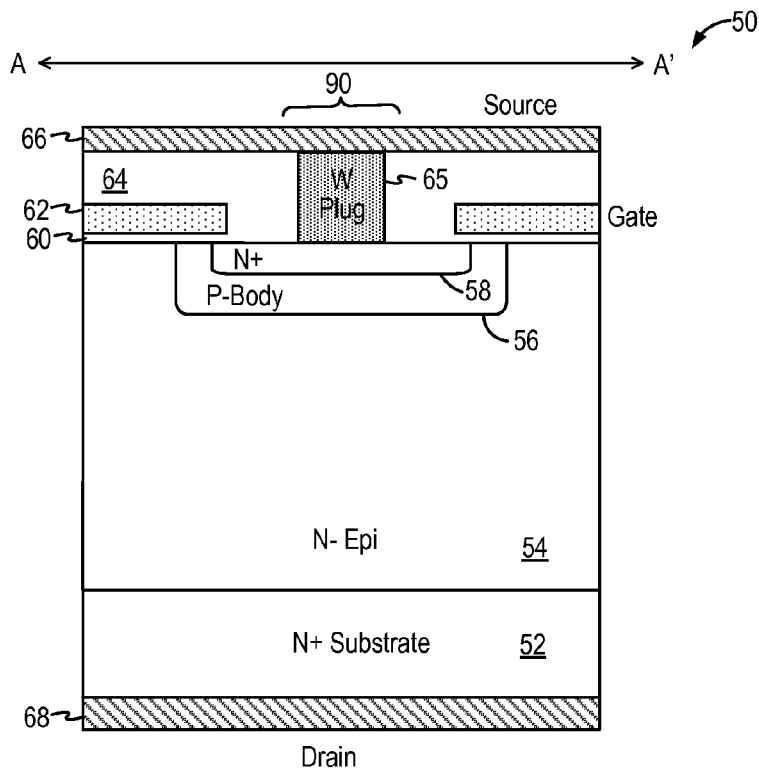
FIG. 4 is a cross-sectional view of the vertical DMOS transistor of FIG. 3 along the line A-A' in some embodiments and illustrates the standard contact to the N+ source region.

FIG. 4 is a cross-sectional view of the vertical DMOS transistor of FIG. 3 along the line A-A' in some embodiments and illustrates the standard contact to the N+ source region. Referring to FIG. 4, the vertical DMOS transistor 50 is formed on an N+ substrate 52 with an N-type epitaxial layer 54 formed thereon. The vertical DMOS transistor 50 includes a gate electrode formed by a polysilicon layer 62 and insulated from the epitaxial layer 54 by a thin gate dielectric layer 60. The vertical DMOS transistor 10 further includes a P-type body region 56 formed in the N-type epitaxial layer 54 and an N+ source region 58 formed in the P-body region 56. A dielectric layer 64 is formed over the polysilicon layer 62 and the source region.

In the present embodiment, electrical connection to the source region 58 is made by the source contact 90 formed as a tungsten (W) plug. To that end, an opening is formed in the dielectric layer 64 to the surface of the N+ source region 58 and tungsten 65 is deposited to fill the opening to form the tungsten plug. A source electrode is formed in a metal layer 66 which is formed on the dielectric layer 64 and is connected to the source contact 90. The N-type epitaxial layer 54 and the N+ substrate 52 form the drain of the DMOS transistor 50. A drain electrode is formed using a metal layer 68 formed on the backside of N+ substrate 52. The body region under the gate electrode 62 between the N+ source region 58 and the N-epitaxial layer 54 form the channel region of the DMOS transistor. When the DMOS transistor 50 is turned on, the forward current flows vertically from the drain electrode 68 through the N+ substrate 52 and the N-type epitaxial layer 54 through the channel to the source electrode 66.

Figure 5:
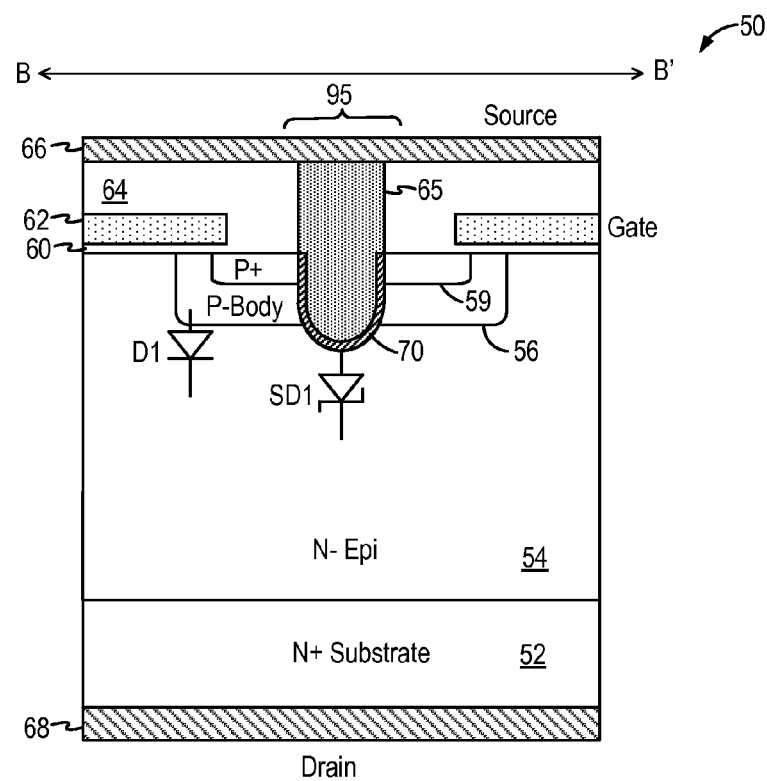
FIG. 5 is a cross-sectional view of the vertical DMOS transistor of FIG. 3 along the line B-B' in some embodiments and illustrates the Schottky contact to the P+ body contact region.

FIG. 5 is a cross-sectional view of the vertical DMOS transistor of FIG. 3 along the line B-B' in some embodiments and illustrates the Schottky contact to the P+ body contact region. In DMOS transistor 50, the source contact 90 is formed using the standard tungsten plug contact while the body contact 95 is formed using the Schottky contact of the present invention. Referring to FIG. 5, to enable ohmic connection to the P-body region 56, heavily doped P+ body contact regions 59 are formed in the P-body region 56 at regular intervals. For instance, in the example shown in FIG. 3, P+ body contact regions are formed at two ends of the DMOS transistor cell. In most applications, the P-body is electrically shorted to the source of the transistor.

In a conventional DMOS transistor device, a contact, such as the tungsten plug contact of FIG. 4, would have been used as the body contact to connect the P+ body contact region 59 to an overlaying metal layer, such as the metal layer 66. However, in embodiments of the present invention, instead of the standard contact, a Schottky contact 95 is formed in the P+ body contact region for providing the electrical connection to the P-body region 56 and also to integrate a Schottky diode into the DMOS transistor device. In some embodiments, the Schottky contact 95 has the same planar dimension as a standard contact so that integration of the trench Schottky diode does not increase the die size of the DMOS transistor device or consumes additional silicon area in the DMOS transistor device.

More specifically, a trench is formed in the dielectric layer 64 and the P+ body contact region 59, the trench reaching through the P-body region 56 into the N-type epitaxial layer 54. A Schottky metal layer 70 is formed in the trench where the Schottky metal layer 70 lines the sidewall of the trench adjacent the P+ body contact region 59, the P-body region 56 and a portion of the N-type epitaxial layer 54 under the P-body region 56. The trench is then filled with a metal layer, such as tungsten 65, to form a tungsten plug contact structure. The Schottky contact 95 can then be electrically connected to an overlying metal layer, such as metal layer 66. When the body of the transistor is to be shorted to the source, the metal layer 66 in FIG. 5 can be the same metal layer that connects to the tungsten plug contact 90 in FIG. 4.

As thus configured, a Schottky diode is integrated into the body contact of the DMOS transistor device 50 using only one additional mask in the fabrication process. A salient feature of the Schottky contact of the present invention is that the trench Schottky diode can be integrated into the body contact without consuming additional silicon area and the Schottky contact process integrates well with standard fabrication process flow. As thus formed, the vertical DMOS transistor 50 has a body diode D1 formed by the P-body region 56 as the anode and the N-type epitaxial layer 54 as the cathode. Furthermore, connected in parallel to the body diode D1 is a Schottky diode SD1 formed by the Schottky metal layer 70 as the anode and the N-type epitaxial layer 54 as the cathode. The Schottky diode SD1 is connected in parallel to the body diode D1 as both diodes have their anode terminals connected to the P-body region 56 and their cathode terminals connected to the N-type epitaxial layer 54.

Another salient feature of the Schottky contact of the present invention is that the Schottky diode is formed having the P-body region 56 acting as a guard ring to reduce reverse leakage. The performance of the Schottky diode is thus improved.

Figure 6A:
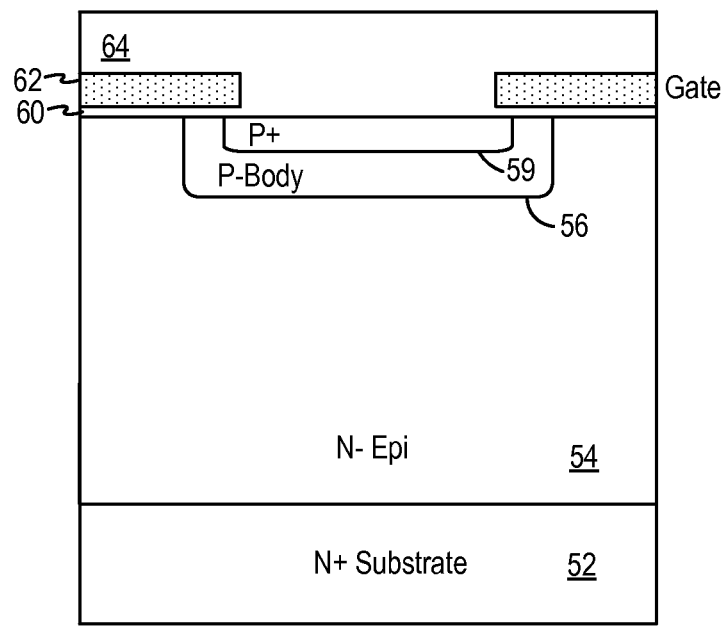
FIGS. 6A-6E illustrate the intermediate processing steps for forming the Schottky contact in embodiments of the present invention.

FIGS. 6A-6E illustrate the intermediate processing steps for forming the Schottky contact in embodiments of the present invention. Referring first to FIG. 6A, a DMOS transistor is formed on an N+ substrate 52 with an N-type epitaxial layer 54 formed thereon. A thin gate dielectric layer 60 and a polysilicon layer 62 are formed on the top surface of the N-type epitaxial layer 54. The polysilicon layer 62 is patterned to form the gate electrode of the transistor. A P-body implant mask is used to perform P-type ion implantation to form the P-body region 56. Then, a P+ implant mask is used to perform heavily doped P-type ion implantation to form the P+ body contact region 59 in the P-body region 56. N+ source region implantation is also performed but the description is omitted here as those steps are not related to the Schottky contact formation. A dielectric layer 64 is formed over the polysilicon layer 62 and the N-Epitaxial layer 54 with the P+ body contact region 59 and the P-body region 56 formed therein.

Figure 6B:
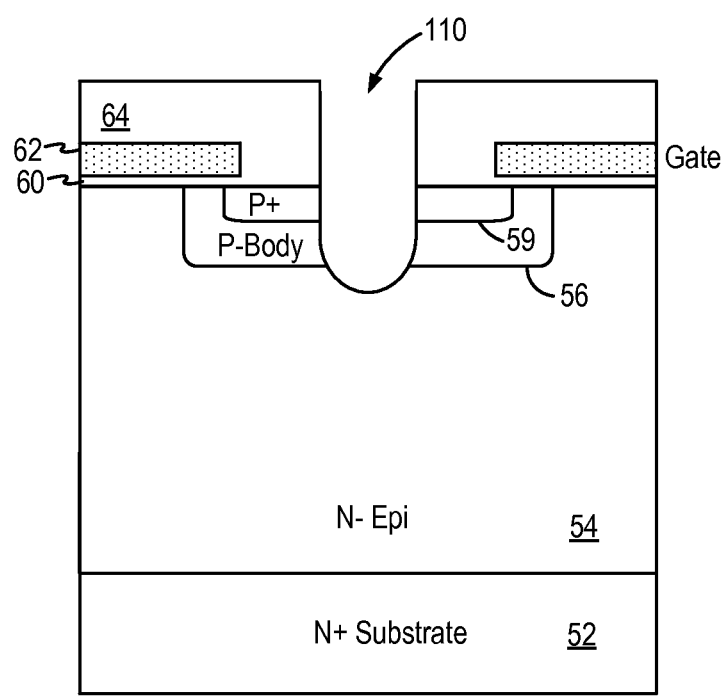

Then, referring to FIG. 6B, a Schottky contact mask is used to define an area where the Schottky contact is to be formed. Using the Schottky contact mask, the dielectric layer 64 is etched to the top surface of the semiconductor layer to form an opening. In the present description, the semiconductor layer refers to the silicon layer forming the N-Epitaxial layer 54 and containing the P+ body contact region 59 and the P-body region 56. Then, using the Schottky contact mask, the semiconductor layer is etched through to form a trench 110 in the semiconductor layer. More specifically, the trench 110 reaches through the P+ body contact region 59 and the P-body region 56 to the N-Epitaxial layer 54.

Figure 6C:
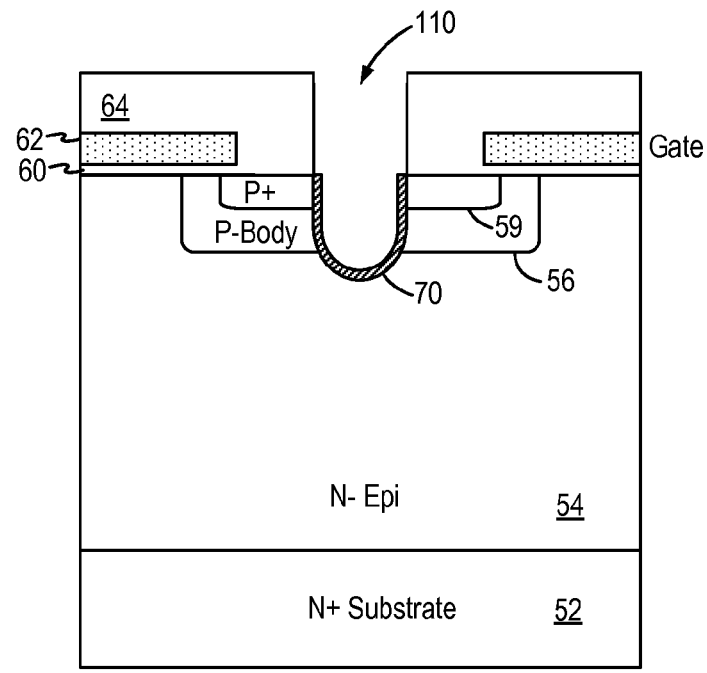

Referring now to FIG. 6C, a Schottky metal 70 is formed along the sidewall of the trench 110 in the semiconductor layer only. In some embodiments, the Schottky metal 70 is of a metal silicide and is formed using a metal that reacts with exposed silicon to form the metal silicide. For example, metal silicide is often formed using a refractory metal, such as titanium (Ti) and Tantalum (Ta), in contact with exposed silicon and thermal annealing to form the silicide at the silicon junction. Accordingly, in some embodiments, the Schottky metal 70 is formed by depositing a metal layer over the semiconductor structure of FIG. 6B. That is, the metal layer can be deposited everywhere including inside the trench 110 and on the sidewall and above the dielectric layer 64. Then a thermal annealing cycle is performed. The deposited metal layer reacts with the exposed silicon in the trench 110 to form a metal silicide as the Schottky metal 70. The unreacted metal is then etched off leaving the Schottky metal 70 only in the trench 110 where there was exposed silicon. For example, the Schottky metal could be titanium (Ti) which is converted into titanium silicide ($TiSi_2$) after thermal annealing.

Figure 6D:
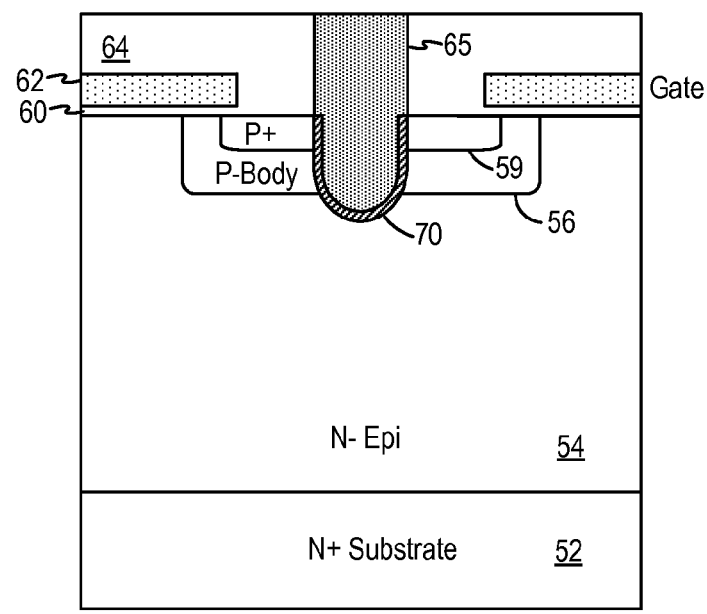
Figure 6E:
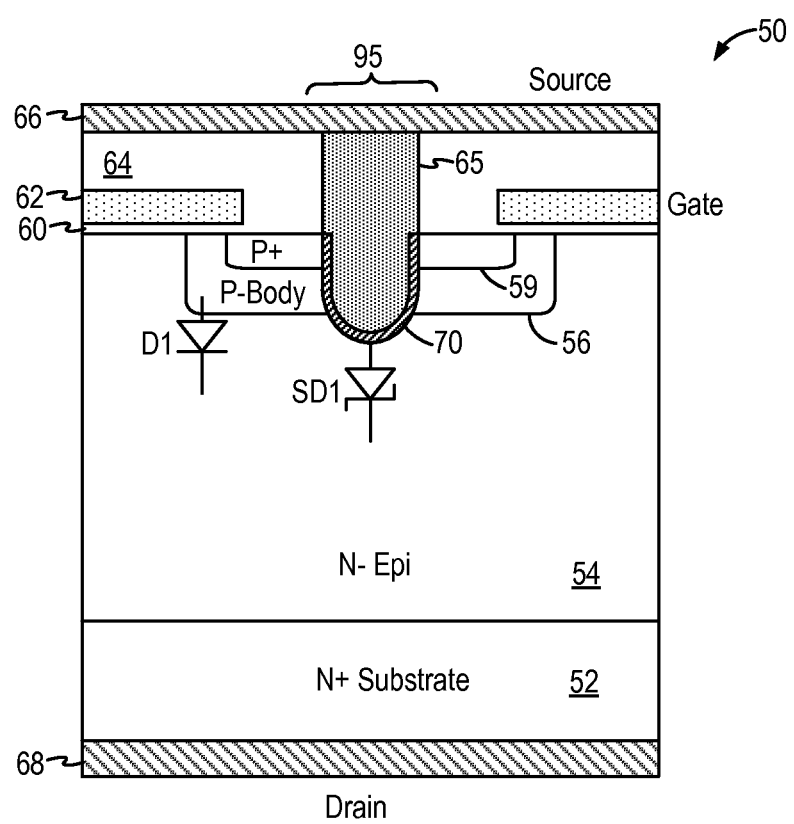

Referring now to FIG. 6D, the trench 110 is filled with a metal layer, such as tungsten 65 to form a tungsten plug. After the Schottky contact is formed, the standard contact mask is applied to form the source contacts and the tungsten plug in the source contacts, such as source contact 90 in FIG. 4. Then, referring to FIG. 6E, a metal layer 66 is deposited and patterned to form metal interconnection. A backside metal layer 68 is also formed on the backside of the N+ substrate 52 as the drain electrode.

In the above description, the DMOS transistor is an N-type transistor. It is understood that a P-type DMOS transistor can be formed by reversing the polarity of the diffusion regions. The trench Schottky diode with body region guard ring can be integrated in a P-type DMOS transistor or an N-type DMOS transistor.

Furthermore, in the above described embodiments, the DMOS transistor is a vertical DMOS transistor with a vertical drain current path. In other embodiments, the trench Schottky diode with body region guard ring can be integrated into a lateral DMOS transistor with a lateral drain current path. The trench Schottky diode can be integrated by using the Schottky contact to replace the body contact so that a Schottky diode is formed at the same location as the body contact.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A vertical DMOS transistor comprising:
   a semiconductor layer of a first conductivity type forming a drain region of the DMOS transistor;
   a body region of a second conductivity type formed in the semiconductor layer;
   a conductive gate formed on a first surface of the semiconductor layer and insulated from the semiconductor layer by a gate dielectric layer;

a source region of the first conductivity type formed in the body region on one side of the conductive gate;

a heavily doped body contact region formed in the body region on the same side of the conductive gate as the source region and adjacent the source region in a lateral direction along the surface of the semiconductor layer;

a trench formed in the heavily doped body contact region and the body region, a bottom of the trench reaching through the body region into the semiconductor layer;

a Schottky metal layer formed in the sidewall of the trench;

a metal layer filling the trench to form a body contact, the Schottky metal layer and the metal layer being formed without physically contacting the source region, wherein the body contact provides electrical connection to the body region of the DMOS transistor and a Schottky diode is formed having the Schottky metal as the anode and the semiconductor layer as the cathode, and the body region surrounding the trench forms a guard ring for the Schottky diode.

2. The vertical DMOS transistor of claim 1, further comprising:

a dielectric layer formed above the conductive gate and the semiconductor layer, the dielectric layer having an opening above the trench, wherein the metal layer fills the opening in the dielectric layer and the trench to form the body contact and wherein the Schottky metal layer is formed on the sidewall of the trench only and not on the sidewall of the opening in the dielectric layer.

3. The vertical DMOS transistor of claim 2, further comprising:

a second metal layer formed on the dielectric layer and in electrical contact to the body contact.

4. The vertical DMOS transistor of claim 2, further comprising:

a source contact formed in the dielectric layer and in electrical contact to the source region.

5. The vertical DMOS transistor of claim 4, wherein the source contact comprises a tungsten plug contact.

6. The vertical DMOS transistor of claim 5, wherein the body contact and the source contact have the same planar dimension.

7. The vertical DMOS transistor of claim 1, wherein the Schottky metal layer comprises a metal silicide layer.

8. The vertical DMOS transistor of claim 1, wherein the first conductivity type comprises N-type conductivity and the second conductivity type comprises P-type conductivity.

9. The vertical DMOS transistor of claim 1, wherein the first conductivity type comprises P-type conductivity and the second conductivity type comprises N-type conductivity.

10. A DMOS transistor comprising:

a body region of a first conductivity type formed in a semiconductor layer;

a conductive gate formed on a first surface of the semiconductor layer and insulated from the semiconductor layer by a gate dielectric layer;

a source region of a second conductivity type formed in the body region on one side of the conductive gate;

a heavily doped body contact region formed in the body region on the same side of the conductive gate as the source region and adjacent the source region in a lateral direction along the surface of the semiconductor layer;

a trench formed in the heavily doped body contact region and the body region, a bottom of the trench reaching through the body region into the semiconductor layer;

a Schottky metal layer formed in the sidewall of the trench; and a metal layer filling the trench to form a body contact, the Schottky metal layer and the metal layer being formed without physically contacting the source region, wherein the body contact provides electrical connection to the body region of the DMOS transistor and a Schottky diode is formed having the Schottky metal as the anode and the semiconductor layer as the cathode, and the body region surrounding the trench forms a guard ring for the Schottky diode.

* * * * *